(12) United States Patent
Kim et al.

(10) Patent No.: US 11,728,317 B2
(45) Date of Patent: Aug. 15, 2023

(54) POWER MODULE PACKAGE

(71) Applicant: POWER MASTER SEMICONDUCTOR CO., LTD., Bucheon-si (KR)

(72) Inventors: In-Suk Kim, Bucheon-si (KR); Ki-Myung Yoon, Bucheon-si (KR)

(73) Assignee: POWER MASTER SEMICONDUCTOR CO., LTD., Bucheon-si (KR)

( * ) Notice: Subject to any disclaimer, the term of this patent is extended or adjusted under 35 U.S.C. 154(b) by 76 days.

(21) Appl. No.: 17/315,533

(22) Filed: May 10, 2021

(65) Prior Publication Data

US 2022/0189929 A1 Jun. 16, 2022

(30) Foreign Application Priority Data

Dec. 14, 2020 (KR) ........................ 10-2020-0174640

(51) Int. Cl.
*H01L 25/07* (2006.01)
*H01L 23/373* (2006.01)
(Continued)

(52) U.S. Cl.
CPC ........ *H01L 25/072* (2013.01); *H01L 23/3121* (2013.01); *H01L 23/3735* (2013.01); *H01L 24/05* (2013.01); *H01L 24/13* (2013.01); *H01L 24/32* (2013.01); *H01L 2224/022* (2013.01); *H01L 2224/0401* (2013.01);
(Continued)

(58) Field of Classification Search
CPC ............... H01L 25/072; H01L 23/3121; H01L 23/3735; H01L 24/05; H01L 24/13; H01L 24/32; H01L 2224/022; H01L 2224/0401; H01L 2224/05624; H01L 2224/13124; H01L 2224/13144; H01L 2224/13147; H01L 2224/13561; H01L 2224/32227; H01L 24/29; H01L 24/73; H01L 2224/02166; H01L 2224/13082; H01L 2224/13101; H01L 2224/32225; H01L 2224/73253; H01L 25/18; H01L 23/4334; H01L 2924/181; H01L 23/481; H01L 23/31; H01L 23/4924; H01L 23/525; H01L 23/5386; H01L 24/06; H01L 24/09; H01L 24/14; H01L 24/17; H01L 25/0655
See application file for complete search history.

(56) References Cited

U.S. PATENT DOCUMENTS 9,041,183 B2 5/2015 Liang et al.
9,390,996 B2 7/2016 Jeon
2019/0341332 A1* 11/2019 Lin .................... H01L 25/18

FOREIGN PATENT DOCUMENTS

JP 2005-303018 10/2005
KR 10-2005-0022881 3/2005
(Continued)

*Primary Examiner* — Elias Ullah
(74) *Attorney, Agent, or Firm* — Lex IP Meister, PLLC

(57) ABSTRACT

A power module package is provided. The power module package may include: a first substrate; a second substrate; a semiconductor chip disposed between the first substrate and the second substrate; and a mutual-connection layer that is formed between the semiconductor chip and the second substrate and provides conductive connection between the semiconductor chip and the second substrate.

15 Claims, 10 Drawing Sheets

(51) Int. Cl.
 H01L 23/00 (2006.01)
 H01L 23/31 (2006.01)
(52) U.S. Cl.
 CPC ............... *H01L 2224/05624* (2013.01); *H01L 2224/13124* (2013.01); *H01L 2224/13144* (2013.01); *H01L 2224/13147* (2013.01); *H01L 2224/13561* (2013.01); *H01L 2224/32227* (2013.01)

(56) References Cited

FOREIGN PATENT DOCUMENTS

| KR | 10-2008278 | 8/2019 |
| KR | 10-2019-0123099 | 10/2019 |
| KR | 10-2020-0085738 | 7/2020 |

\* cited by examiner

POWER MODULE PACKAGE

CROSS-REFERENCE TO RELATED APPLICATION

This application claims priority to and the benefit of Korean Patent Application No. 10-2020-0174640 filed in the Korean Intellectual Property Office on Dec. 14, 2020, the entire contents of which are incorporated herein by reference.

BACKGROUND OF THE DISCLOSURE

(a) Field of the Disclosure

The present disclosure relates to a power module package.

(b) Description of the Related Art

A power module applied to environment-friendly vehicles, for example, hybrid vehicles (HEVs), electric vehicles (EVs), hydrogen fuel cell vehicles (FCEVs), and the like operates in harsh environments with high operating temperatures and long operating times, and thus high reliability is required. Power devices such as an insulated gate bipolar transistor (IGBT), a metal oxide semiconductor field effect transistor (MOSFET), and a diode may include a semiconductor element such as silicon (Si), silicon carbide (SiC), and gallium nitride (GaN), and one of the factors that determine the reliability and life of a power module by effectively dissipating heat generated from the power device is a chip bonding material and process. Accordingly, research on chip bonding technology that can facilitate stable operation for a long period of time at high temperatures is being actively conducted.

The above information disclosed in this Background section is only for enhancement of understanding of the background of the disclosure, and therefore it may contain information that does not form the prior art that is already known in this country to a person of ordinary skill in the art.

SUMMARY OF THE DISCLOSURE

The present disclosure has been made in an effort to provide a double-sided cooling power module package that provide high operation stability at high temperature environment while having excellent electrical performance.

A power module package according to an embodiment of the present disclosure may include: a first substrate; a second substrate; a semiconductor chip disposed between the first substrate and the second substrate; and a mutual-connection layer that is formed between the semiconductor chip and the second substrate and provides conductive connection between the semiconductor chip and the second substrate.

The first substrate and the second substrate may include direct bonded copper (DBC) substrates.

The mutual-connection layer comprises a metal pillar.

The metal pillar may be formed on the second substrate through soldering, sintering, diffusion, or an adhesive material.

The metal pillar may be formed on the second substrate through micro-welding or Cu-sintering.

A bonding pad may be formed on the semiconductor chip, and the mutual-connection layer may include a solder paste formed on the bonding pad.

An under bump metallurgy (UBM) layer may be formed on the semiconductor chip, and the mutual-connection layer may include a solder bump or a solder lump formed on the UBM layer.

The mutual-connection layer may include a coated core.

A bonding pad may be formed on the semiconductor chip, and the mutual-connection layer may include an Au or Cu stud bump formed on the bonding pad.

An underfilling layer or encapsulation layer may be formed between the semiconductor chip and the second substrate.

A power module package according to an embodiment of the present disclosure includes: a semiconductor chip; a first external metal layer, a first internal metal layer, and a first ceramic layer that is formed between the first external metal layer and the first internal metal layer; and a second external metal layer, a second internal metal layer, and a second ceramic layer formed between the second external metal layer and the second internal metal layer, wherein a first side of the semiconductor chip contacts the first internal metal layer, and a second side of the semiconductor chip contacts the second internal metal layer through a mutual-connection layer.

The mutual-connection layer may include a metal pillar.

The metal pillar may be formed on the second internal metal layer through soldering, sintering, diffusion, or an adhesive material.

The metal pillar may be formed on the second internal metal layer through micro-welding or Cu-sintering.

A bonding pad may be formed on the second side of the semiconductor chip, and the mutual-connection layer may include a solder paste formed on the bonding pad.

An under bump metallurgy (UBM) layer may be formed on the second side of the semiconductor chip, and the mutual-connection layer may include a solder bump or a solder lump formed on the UBM layer.

The mutual-connection layer may include a coated core.

A bonding pad may be formed below the semiconductor chip, and the mutual-connection layer may include an Au or Cu stud bump formed on the bonding pad.

An underfilling layer or encapsulation layer may be formed between the semiconductor chip and the second substrate.

A power module package according to an embodiment of the present disclosure may include: a first semiconductor chip and a second semiconductor chip; a first substrate that is formed above the first semiconductor chip and the second semiconductor chip; a second substrate that is formed above the first semiconductor chip and the second semiconductor chip; a first mutual-connection layer that is formed between the first semiconductor chip and the first substrate, and provides conductive connection between the first semiconductor chip and the first substrate; and a second mutual-connection layer that is formed between the second semiconductor chip and the second substrate, and provides conductive connection between the second semiconductor chip and the second substrate.

According to the embodiments of the present disclosure, in the bonding pad of the power device, the power device is directly connected to the substrate (e.g., DBC substrate) of the double-sided cooling power module package through the mutual-connection layer in the shape of a bump rather than an alloy spacer, and thus, compared to the double-sided cooling power module package using an alloy spacer, the electrical performance is excellent because it has lower inductance, faster switching speed, and higher current carrying capacity. In addition, thermal and mechanical strength is excellent by bonding the power device to a substrate (e.g., DBC substrate) through a plurality of bump-shaped module-connection layers.

Meanwhile, since a bonding wire, which is a main cause of product defects, is not used, the defect rate can be significantly lowered, thereby improving product stability and reliability, and heat generated from the bonding pad of the power device can be released directly to the substrate (e.g., DBC substrate), and thus the heat generated from the bottom surface of the power device is released directly to the substrate (e.g., DBC substrate) without an alloy spacer, thereby providing high operating stability and high reliability.

In addition, according to the embodiments of the present disclosure, a re-distribution layer (RDL) is applied with respect to a size and a position of the previously formed bonding pad, or through the UBM process, the desired position and size can be implemented as needed, and thus it is possible to widen the limits of design such as package structure, size, and standard, and improve reliability. In addition, according to the embodiments of the present disclosure, more flexible height control is possible by adjusting the height of the bump compared to the double-sided cooling power module package using an alloy spacer. Accordingly, the chip (power device) and the alloy spacer are singulated, and each chip and individual alloy spacers are joined one by one using a specially manufactured jig or tool and expensive equipment, and low productivity due to the process of bonding to a substrate (e.g., DBC substrate), high defects such as chip cracking and chipping, and complex processes can be avoided. That is, the manufacturing process is simple, productivity is high, general equipment can be used by bump-bonding the chip on which the bump is formed to the substrate (e.g., DBC substrate), and material cost is reduced because expensive alloy spacers are not used.

DETAILED DESCRIPTION OF THE EMBODIMENTS

Figure 1:
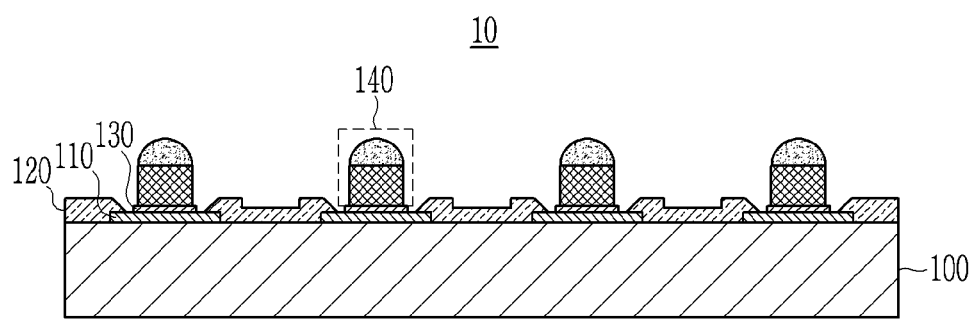
FIG. 1 is provided for description of a semiconductor device according to an embodiment of the present disclosure.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure. Accordingly, the drawings and description are to be regarded as illustrative in nature and not restrictive. Like reference numerals designate like elements throughout the specification.

In addition, unless explicitly described to the contrary, the word "comprise", and variations such as "comprises" or "comprising", will be understood to imply the inclusion of stated elements but not the exclusion of any other elements.

FIG. 1 is provided for description of a semiconductor device according to an embodiment of the present disclosure.

Referring to FIG. 1, a semiconductor device 10 according to an embodiment of the present disclosure includes a semiconductor chip 100, bonding pads 110, a passivation layer 120, under bump metallurgy (UBM) layers 130, and mutual-connection layers 140.

The semiconductor chip 100 may be a power semiconductor chip (power device). As the power semiconductor chip, a semiconductor switch such as a field effect transistor (FET), a metal oxide semiconductor FET (MOSFET), an insulated gate bipolar transistor (IGBT), a power rectification diode, and the like, a thyristor, a gate turn-off (GTO) thyristor, a TRIAC, a silicon controlled rectifier (SCR), an integrated circuit (IC), and the like may be included. In particular, a power MOSFET device may be used, and a high voltage high current operation may have a double-diffused metal oxide semiconductor (DMOS) structure unlike a general MOSFET. However, the range of the present disclosure is not limited to these examples.

The bonding pad 110 may be formed on the semiconductor chip 100. The bonding pad 110 may include aluminum (Al), but the range of the present disclosure is not limited thereto, and may include other conductive materials.

In addition, the UBM layer 130 may be formed on the bonding pad 110. The UBM layer 130 may be formed to facilitate adhesion between the bonding pad 110 of the semiconductor chip 100 and the mutual-connection layer 140. For example, when the bonding pad 110 is formed of aluminum (Al), an oxide layer formed on the aluminum (Al) is removed when it comes into contact with air, and the UBM layer 130 is formed thereon to improve adhesion with the mutual-connection layer 140. Therefore, the UBM layer 130 is generally formed to have good electrical connection with aluminum (Al) and low resistance.

Meanwhile, the passivation layer 120 may be formed on the semiconductor chip 100 to protect the surface of the semiconductor chip 100 or provide insulation between the bonding pad 110 and the UBM layers 130.

In embodiments of the present disclosure, the semiconductor chip 100 may include the mutual-connection layer 140 on the bonding pad 110 or the UBM layer 130. The mutual-connection layer 140 may be disposed above or below the semiconductor chip 100 to provide a conductive connection with the substrates 20 and 30 for forming a double-sided cooling power module package.

Figure 2:
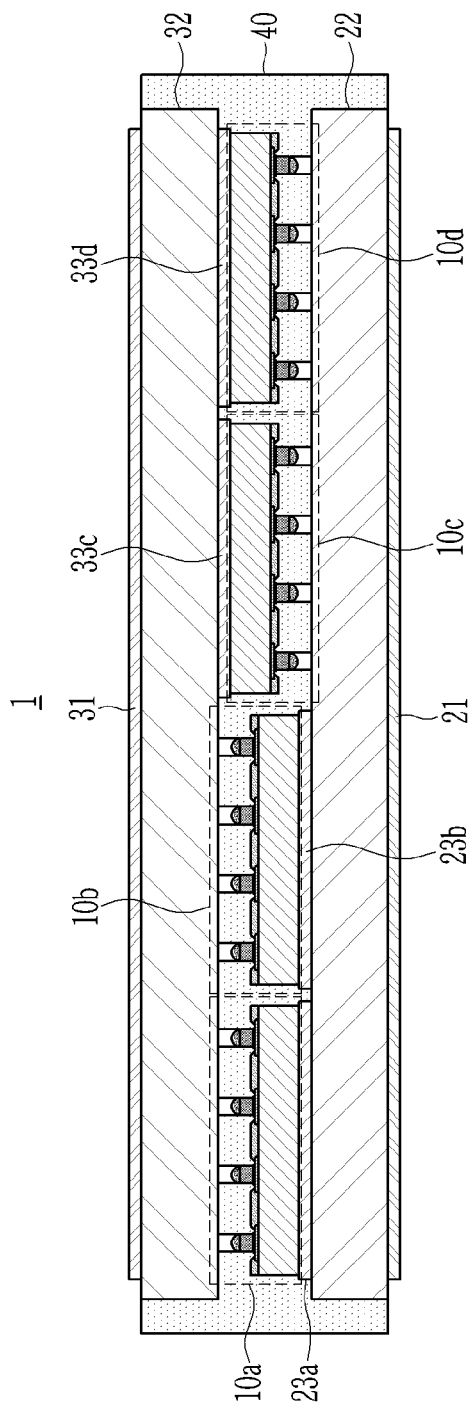
FIG. 2 is provided for description of a power module package according to the embodiment of the present disclosure.

FIG. 2 is provided for description of a power module package according to the embodiment of the present disclosure.

Referring to FIG. 2, a power module package 1 according to the embodiment of the present disclosure may include a first substrate 30, a second substrate 20, and one or more of semiconductors 10a to 10d disposed between the first substrate 30 and the second substrate 20.

Each of the semiconductor devices 10a to 10d may have a structure of the semiconductor device 10 described with reference to FIG. 1. In general, a double-sided cooling power module package can meet electrical specifications only when a plurality of semiconductor devices 10a to 10d are disposed in the form of a multi-chip, and specifically, the semiconductor devices 10a to 10d may respectively include semiconductor chips 100a to 100d, bonding pads 110a to 110d, passivation layers 120a to 120d, UBM layers 130a to 130d, and mutual-connection layers 140a to 140d. In FIG. 2, to clearly illustrate the overall structure of the power module package 1 including the semiconductor devices 10a to 10d, reference numerals for the semiconductor chip 100a, the bonding pad 110a, the passivation layer 120a, the UBM layer 130a, and the mutual-connection layer 140a inside the semiconductor device 10a are not indicated, and this is the same for semiconductor devices 10b, 10c, and 10d.

In the present embodiment, the mutual-connection layer 140a of the semiconductor device 10a may be disposed between the semiconductor chip 100a and the first substrate 30, and the mutual-connection layer 140b of the semiconductor device 10b may be disposed between the semiconductor chip 100b and the first substrate 30. Thus, the mutual-connection layer 140a may provide conductive connection between the semiconductor chip 100a and the first substrate 30, and the mutual-connection layer 140b may provide conductive connection between the semiconductor chip 100b and the first substrate 30.

Meanwhile, the mutual-connection layer 140c of the semiconductor device 10c may be disposed between the semiconductor chip 100c and the second substrate 20, and the mutual-connection layer 140d of the semiconductor device 10d may be disposed between the semiconductor chip 100d and the second substrate 20. Thus, the mutual-connection layer 140c may provide conductive connection between the semiconductor chip 100c and the second substrate 20, and the mutual-connection layer 140d may provide conductive connection between the semiconductor chip 100d and the second substrate 20.

In addition, an encapsulation layer 40 may be formed between the first substrate 30 and the second substrate 20. The encapsulation layer 40 may be formed of an encapsulant such as an epoxy molding compound (EMC). Here, the EMC may be made of a composite material in which various raw materials such as silica, an epoxy resin, a phenol resin, carbon black, and a flame retardant are used.

The structure shown in FIG. 2 is only one configuration example of a power module package, and the range of the present disclosure is not limited thereto.

Figure 3:
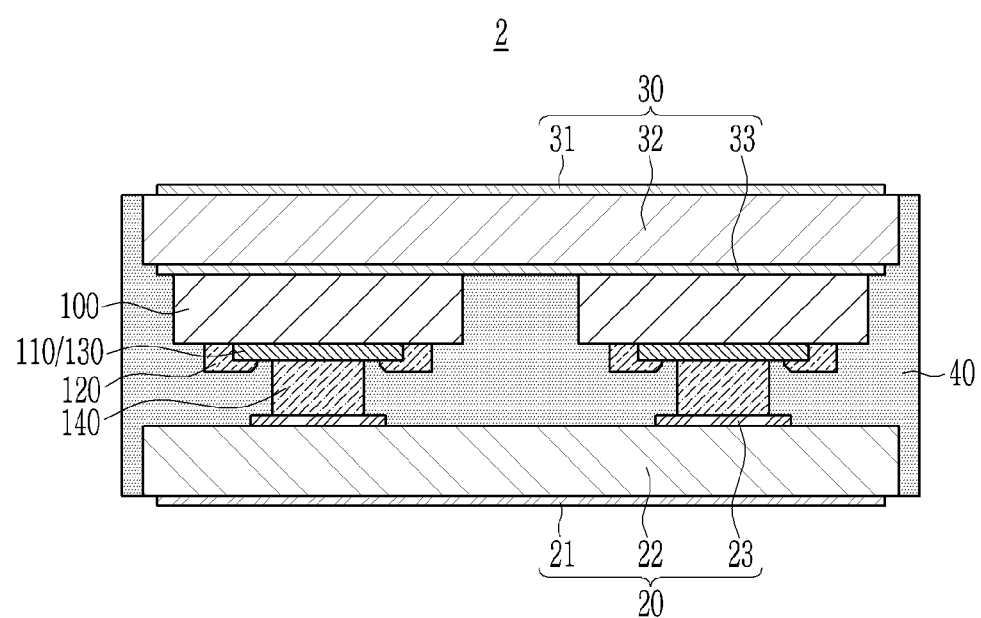
FIG. 3 is provided for description of a power module package according to an embodiment of the present disclosure.

FIG. 3 is provided for description of q power module package according to an embodiment of the present disclosure.

Referring to FIG. 3, a power module package 2 according to an embodiment of the present disclosure corresponds to an enlarged part of the power module package 1 of FIG. 2, and the power module package 2 may include a semiconductor chip 100, a first substrate 30 formed above the semiconductor chip 100, a second substrate 20 formed below the semiconductor chip 100, and a mutual-connection layer 140 formed between the semiconductor chip 100 and the second substrate 20, and provides conductive connection between the semiconductor chip 100 and the second substrate 20.

The structure shown in FIG. 3 corresponds to the semiconductor devices 10c and 10d of FIG. 2, but the range of the present disclosure is not limited thereto, and the structure of FIG. 3 can also be applied to the semiconductor devices 10a and 10b of FIG. 2 by only changing positions of the first substrate 30 and the second substrate 20, and this is well known to a person of ordinary skill in the art.

The first substrate 30 may include a DBC substrate. When the first substrate 30 is a DBC substrate, the first substrate 30 may include a first external metal layer 31, a first internal metal layer 33, and a first ceramic layer 32 disposed between the first external metal layer 31 and the first internal metal layer 33. In general, the first external metal layer 31 and the first internal metal layer 33 may include cooper (Cu), but the range of the present disclosure is not limited thereto.

The second substrate 20 may also include a DBC substrate. When the second substrate 20 is a DBC substrate, the second substrate 20 may include a second external metal layer 21, a second internal metal layer 23, and a second ceramic layer 22 disposed between the second external metal layer 21 and the second internal metal layer 23. In general, the second external metal layer 21 and the second internal metal layer 23 may include copper (Cu), but the present disclosure is not limited thereto.

The first substrate 30 and the second substrate 20 may use other metal substrates to form a double-sided cooling power module package.

In the present embodiment, a first side (top side) of the semiconductor chip 100 contacts the first internal metal layer 33, and a second side (bottom side) of the semiconductor chip 100 may contact the second internal metal layer 23 through the mutual-connection layer 140. In this case, a bonding pad 110 may be formed between the second side of the semiconductor chip 100 and the top side of the mutual-connection layer 140, or the bonding pad 110 and an UBM layer 130 may be formed therebetween.

Hereinafter, various implement examples of the mutual-connection layer 140 will be described with reference to FIG. 4 to FIG. 10.

Figure 4:
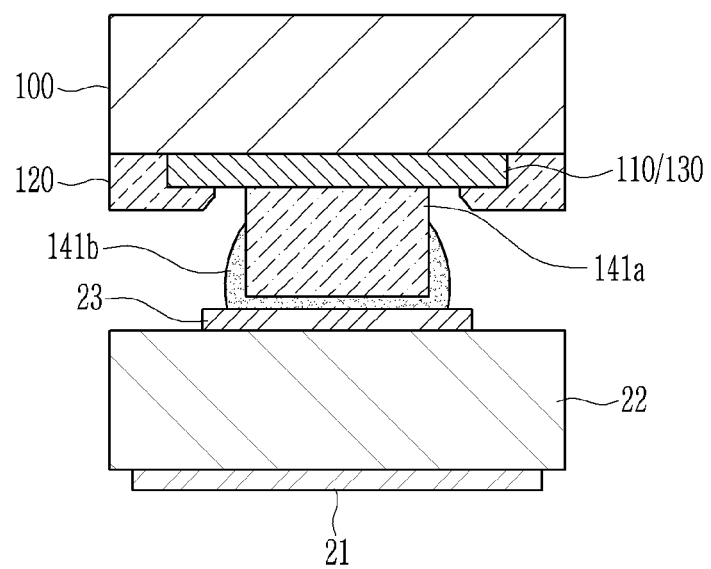
FIG. 4 is provided for description of a mutual-connection layer of a power module package according to an embodiment of the present disclosure.

FIG. 4 is provided for description of a mutual-connection layer of the power module package according to the embodiment of the present disclosure.

Referring to FIG. 4, in one Implementation Example 11, a mutual-connection layer 140 of the embodiment of the present disclosure may include a metal pillar 141a. Here, the metal pillar 141a may be a copper (Cu) pillar, but the present disclosure is not limited thereto.

The metal pillar 141a may be formed on the second substrate 20 through soldering, sintering, diffusion, or an adhesive material, as indicated by reference numeral 141b. When the second substrate 20 is DBC, the metal pillar 141a may be formed on the second internal metal layer 23 through soldering, sintering, diffusion, or an adhesive material, as indicated by reference numeral 141b.

In this case, the bonding pad 110 or the bonding pad 110 and the UBM layer 130 may be formed below the semiconductor chip 100, and the metal pillar 141a may be formed on the bonding pad 110 or the UBM layer 130.

According to the present embodiment, it is possible to secure a higher current carrying capacity than the case of using an alloy spacer by using the metal pillar 141a as the mutual-connection layer 140, thereby improving electrical performance, mechanical strength, and heat dissipation performance. In addition, unlike the case of using an alloy spacer, the height of the mutual-connection layer 140 can be variously modified according to the purpose of manufacturing the power module package, and thus the manufacturing process can be flexibly adjusted, as well as providing simplification of the manufacturing process and cost reduction.

Figure 5:
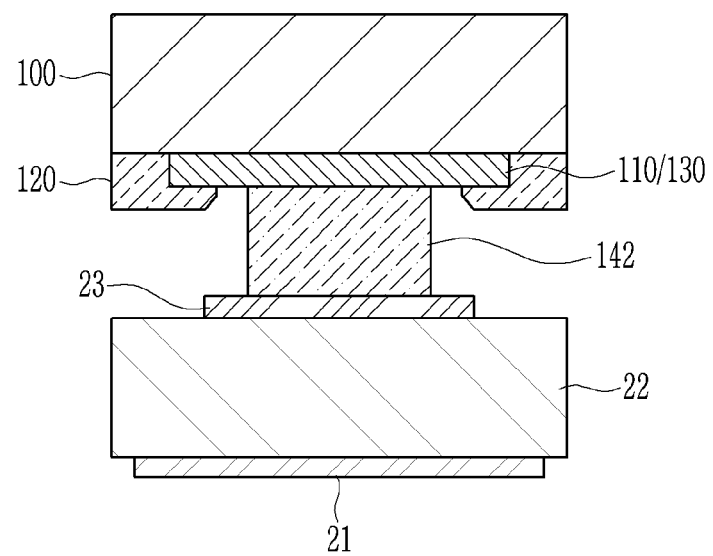
FIG. 5 is provided for description of a mutual-connection layer of a power module package according to an embodiment of the present disclosure.

FIG. 5 is provided for a mutual-connection layer of the power module package according to the embodiment of the present disclosure.

Referring to FIG. 5, in one Implementation Example 12, a mutual-connection layer 140 of the embodiment of the present disclosure may include a metal pillar 142. Here, the metal pillar 142 may be a copper (Cu) pillar, but the present disclosure is not limited thereto.

The metal pillar 142 may be formed on the second substrate 20 through micro-welding or Cu-sintering. When the second substrate 20 is DBC, the metal pillar 142 may be formed on the second internal metal layer 23 through micro-welding or Cu-sintering.

In this case, the bonding pad 110 or the bonding pad 110 and the UBM layer 130 may be formed below the semiconductor chip 100, and the metal pillar 142 may be formed on the bonding pad 110 or the UBM layer 130.

According to the present embodiment, it is possible to secure a higher current carrying capacity than the case of using an alloy spacer by using the metal pillar 142 as the mutual-connection layer 140, thereby improving electrical performance, mechanical strength, and heat dissipation performance. In addition, unlike the case of using an alloy spacer, the height of the mutual-connection layer 140 can be variously modified according to the purpose of manufacturing the power module package, and thus the manufacturing process can be flexibly adjusted, as well as providing simplification of the manufacturing process and cost reduction.

Figure 6:
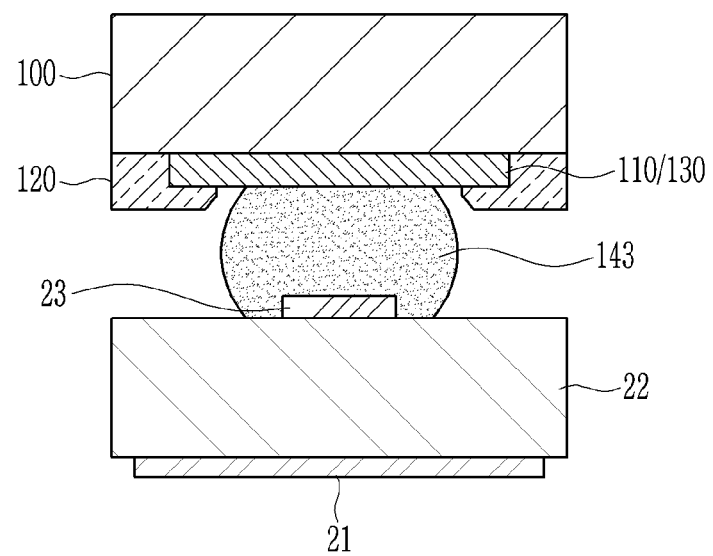
FIG. 6 is provided for description of a mutual-connection layer of a power module package according to an embodiment of the present disclosure.

FIG. 6 is provided for a mutual-connection layer of the power module package according to the embodiment of the present disclosure.

Referring to FIG. 6, in one Implementation Example 13, the mutual-connection layer 140 of the power module package according to the embodiment of the present disclosure may include a solder paste, a solder bump, or a solder lump 143.

When the bonding pad 110 is formed below the semiconductor chip 100, the mutual-connection portion 140 of the power module package mutual-connection layer 140 may include a solder paste 143, and when the bonding pad 110 and the UBM layer 130 are formed below the semiconductor chip 100, the mutual-connection layer 140 of the power module package may include a solder bump or a solder lump. In this case, the solder paste may include aluminum.

According to the present embodiment, by using the solder paste, the solder bump, or the solder paste 43, a higher current carrying capacity can be secured compared to the case of using an alloy spacer by using the mutual-connection layer 140, thereby improving electrical performance, mechanical strength, and heat dissipation performance. In addition, unlike the case of using an alloy spacer, the height of the mutual-connection layer 140 can be variously modified according to the purpose of manufacturing the power module package, and thus the manufacturing process can be flexibly adjusted, as well as providing simplification of the manufacturing process and cost reduction.

Figure 7:
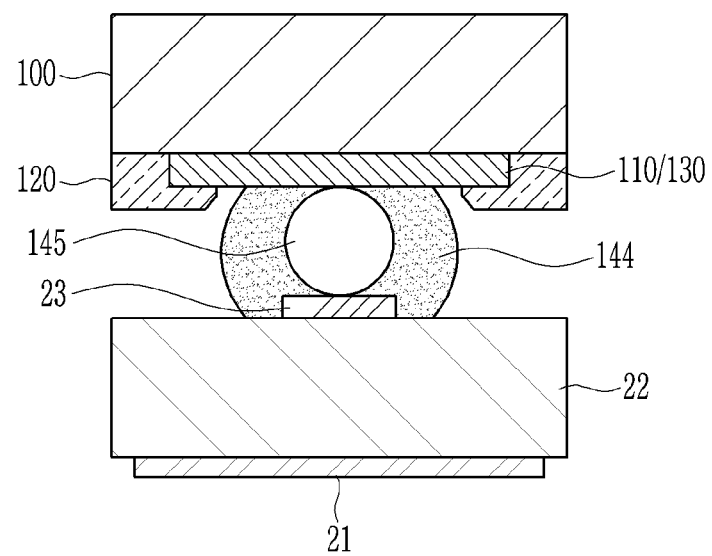
FIG. 7 is provided for description of a mutual-connection layer of a power module package according to an embodiment of the present disclosure.

FIG. 7 is provided for description of the mutual-connection layer of the power module package according to the embodiment of the present disclosure.

Referring to FIG. 7, in one Implementation Example 14, the mutual-connection layer 140 of the power module package may include a coating core 144.

In this case, the bonding pad 110 or the bonding pad 110 and the UBM layer 130 are formed below the semiconductor chip 100, and the mutual-connection layer 140 including the coating core 114 may be formed on the bonding pad 110 or the UBM layer 130.

According to the present embodiment, it is possible to secure a higher current carrying capacity than in the case of using an alloy spacer by using the mutual-connection layer 140 including the coating core 144, thereby improving electrical performance, mechanical strength, and heat dissipation performance. In addition, unlike the case of using an alloy spacer, the height of the mutual-connection layer 140 can be variously modified according to the purpose of manufacturing the power module package, and thus the manufacturing process can be flexibly adjusted, as well as providing simplification of the manufacturing process and cost reduction.

Figure 8:
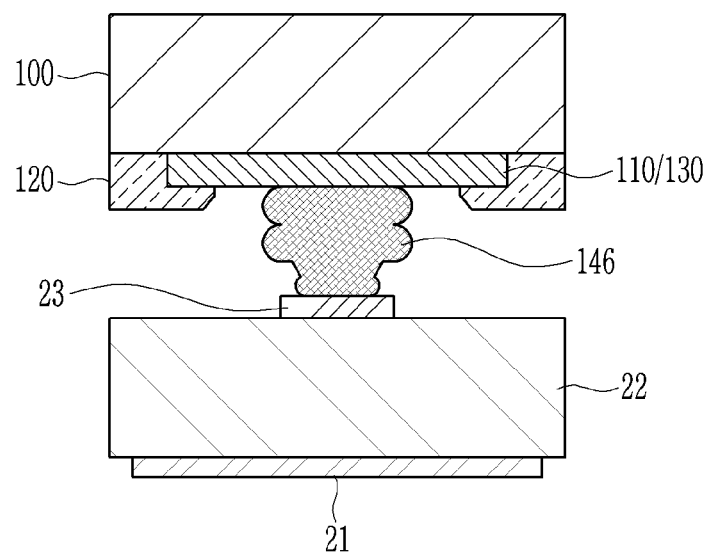
FIG. 8 is provided for description of a mutual-connection layer of a power module package according to an embodiment of the present disclosure.

FIG. 8 is provided for description of the mutual-connection layer of the power module package according to the embodiment of the present disclosure.

Referring to FIG. 8, in one Implementation Example 15, the mutual-connection layer 140 of the power module package according to the embodiment of the present disclosure includes an Au or Cu stud bump 146.

In this case, the bonding pad 110 is formed below the semiconductor chip 100, and the Au or Cu stud bump 146 may be formed on the bonding pad 110.

According to the present embodiment, the Au or Cu stud bump 146 is used as the mutual-connection layer 140 such that it is possible to secure a higher current carrying capacity than in the case of using an alloy spacer, thereby improving electrical performance, mechanical strength, and heat dissipation performance. In addition, unlike the case of using an alloy spacer, the height of the mutual-connection layer 140 can be variously modified according to the purpose of manufacturing the power module package, and thus the manufacturing process can be flexibly adjusted, as well as providing simplification of the manufacturing process and cost reduction.

The embodiments described with reference to FIG. 4 to FIG. 8 may be used in combination with different methods when implementing the power module package 1 of FIG. 2.

For example, one of the implementation examples 11 to 15 may be applied to the semiconductor device 10a included in the power module package 1 of FIG. 2, and another implementation example of the Implementation Examples 11 to 15 may be applied to the semiconductor device 10b. For example, a metal pillar 142 corresponding to the Implementation Example 12 may be used for the semiconductor device 10a, and a solder paste, a solder bump, or a solder lump 143 corresponding to the Implementation Example 13 may be used for the semiconductor device 10b.

Figure 9:
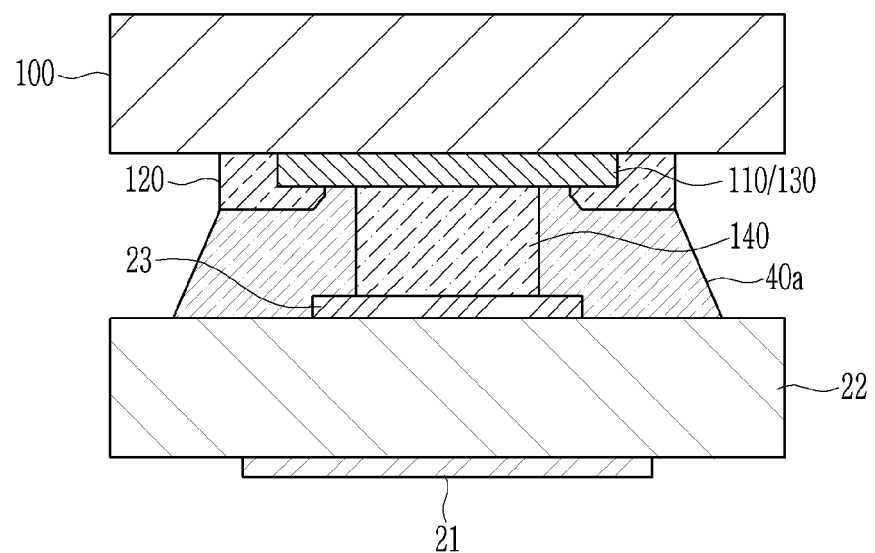
FIG. 9 and FIG. 10 are provided for description of the power module package according to the embodiment of the present disclosure.
Figure 10:
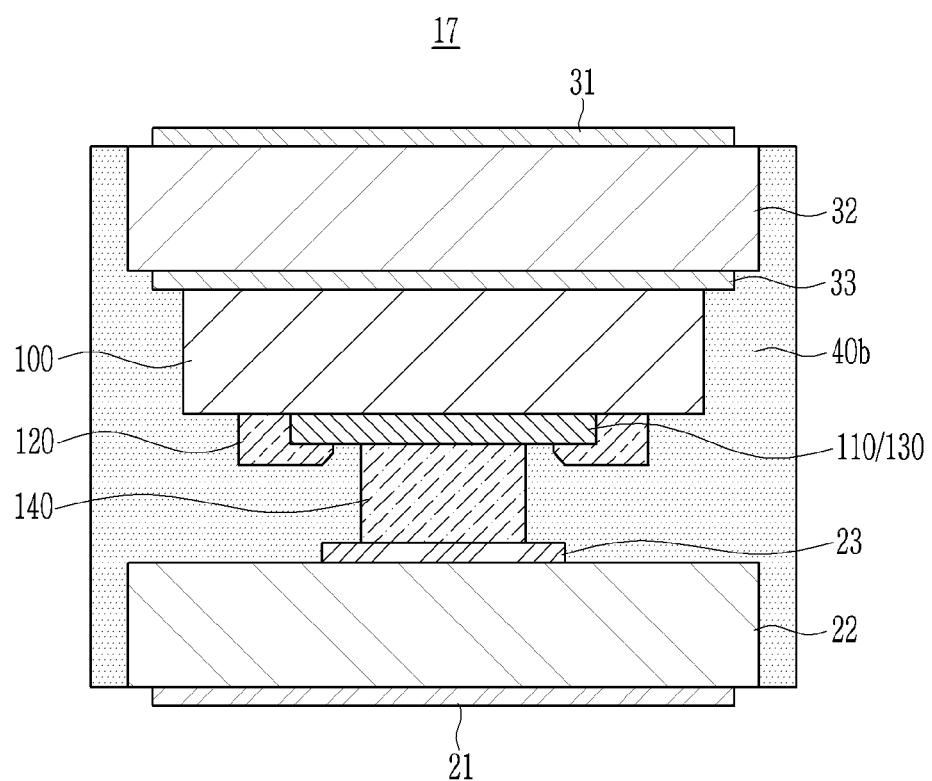

FIG. 9 and FIG. 10 are provided for description of the power module package according to the embodiment of the present disclosure.

Referring to FIG. 9, in Implementation Example 16, the power module package according to the embodiment of the present disclosure may include an underfilling layer 40a between the semiconductor chip 100 and the second substrate 20.

Referring to FIG. 10, in one Implementation Example 17, the power module package according to the embodiment of the present disclosure may include an encapsulation layer 40b between the semiconductor chip 100 and the second substrate 20.

According to the embodiments of the present disclosure described hereinabove, the bonding pad of the power device is directly connected to the substrate (e.g., DBC substrate) of the double-sided cooling power module package through the mutual-connection layer in the shape of a bump rather than an alloy spacer, and thus, compared to the double-sided cooling power module package using an alloy spacer, the electrical performance is excellent because it has lower inductance, faster switching speed, and higher current carrying capacity. In addition, thermal and mechanical strength is excellent by bonding the power device to a substrate (e.g., DBC substrate) through a plurality of bump-shaped mutual-connection layers.

On the other hand, since a bonding wire, which is the main cause of product defects, is not used, the defect rate can be significantly lowered, thereby improving product stability and reliability, and heat generated from the bonding pad of the power device can be released directly to the substrate (e.g., DBC substrate) and thus the heat generated from the bottom surface of the power device is released directly to the substrate (e.g., DBC substrate) without an alloy spacer, thereby providing high operating stability and high reliability.

According to the embodiments of the present disclosure, a re-distribution layer (RDL) is applied with respect to the size and position of the previously formed bonding pad, or implementation of the bonding pad with the desired position and size can be achieved as necessary by using an under bump metallurgy (UBM) process, and thus the limitations of design such as package structure, size, and specifications can be widened and reliability can be improved. In addition, according to the embodiment of the present disclosure, more flexible height control is possible by adjusting the height of the bump compared to the double-sided cooling power module package using an alloy spacer. Accordingly, defects such as low productivity, chip cracking, chipping, and the like due to the bonding process can be avoided through a process in which the chip (power device) and the alloy spacer are singulated, each chip and each alloy spacer are joined one by one using a specially manufactured jig or tool and expensive equipment, and then bonded to a substrate (e.g., DBC substrate). That is, by bump bonding the chip on which the bump is formed to the substrate (e.g., DBC substrate), the manufacturing process can be simplified, productivity becomes high, and general equipment can be used, and material cost is reduced because expensive alloy spacers are not used.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. A power module package comprising:
a first substrate comprising a first external metal layer, a first internal metal layer, and a first ceramic layer disposed between the first external metal layer and the first internal metal layer to form a direct bonded copper (DBC) substrate;
a second substrate comprising a second external metal layer, a second internal metal layer, and a second ceramic layer disposed between the second external metal layer and the second internal metal layer to form a DBC substrate;
a semiconductor chip disposed between the first internal metal layer and the second internal metal layer; and
a mutual-connection layer that is formed between the semiconductor chip and the second internal metal layer and provides conductive connection between the semiconductor chip and the second internal metal layer,
wherein:
a top side of the semiconductor chip directly contacts a bottom side of the first internal metal layer;
when only a bonding pad is formed on a bottom side of the semiconductor chip, a top side of the mutual-connection layer directly contacts the bonding pad, and a bottom side of the mutual-connection layer directly contacts a top side of the second internal metal layer; and
when the bonding pad and an under bump metallurgy (UBM) layer are formed on the bottom side of the semiconductor chip, the top side of the mutual-connection layer directly contacts the UBM layer, and the bottom side of the mutual-connection layer directly contacts the top side of the second internal metal layer.

2. The power module package of claim 1, wherein
the mutual-connection layer comprises a copper (Cu) pillar and an adhesive material,
a top side of the Cu pillar directly contacts the bonding pad or the UBM layer,
a bottom side of the Cu pillar directly contacts a top side of the adhesive material, and
a bottom side of the adhesive material directly contacts the top side of the second internal metal layer.

3. The power module package of claim 1, wherein
the mutual-connection layer comprising a copper (Cu) pillar,
a top side of the Cu pillar directly contacts the bonding pad or the UBM layer, and
a bottom side of the Cu pillar forms direct contact with the top side of the second internal metal layer through micro-welding or Cu-sintering.

4. The power module package of claim 1, wherein
the mutual-connection layer comprises a solder paste,
a top side of the solder paste directly contacts the bonding pad, and
a bottom side of the solder paste directly contacts the top side of the second internal metal layer.

5. The power module package of claim 1, wherein
the mutual-connection layer comprises a solder bump or a solder lump,
a top side of the solder bump or the solder lump directly contacts the UBM layer, and
a bottom side of the solder bump or the solder lump directly contacts the top side of the second internal metal layer.

6. The power module package of claim 1, wherein
The mutual-connection layer comprises a coated core,
a top side of the coated core directly contacts the bonding pad or the UBM layer, and
a bottom side of the coated core directly contacts the top side of the second internal metal layer.

7. The power module package of claim 1, wherein
the mutual-connection layer comprises an Au or Cu stud bump
a top side of the Au or Cu stud bump directly contacts the bonding pad, a bottom side of the Au or Cu stud bump directly contacts the top side of the second internal metal layer.

8. The power module package of claim 1, wherein an underfilling layer or encapsulation layer is formed between the semiconductor chip and the second substrate.

9. A power module package comprising:

a first substrate comprising a first external metal layer, a first internal metal layer, and a first ceramic layer disposed between the first external metal layer and the first internal metal layer to form a direct bonded copper (DBC) substrate;

a second substrate comprising a second external metal layer, a second internal metal layer, and a second ceramic layer disposed between the second external metal layer and the second internal metal layer to form a DBC substrate;

a first semiconductor chip and a second semiconductor chip disposed between the first internal metal layer and the second internal metal layer;

a first mutual-connection layer that is formed between the first semiconductor chip and the first internal metal layer and provides conductive connection between the first semiconductor chip and the first internal metal layer; and a second mutual-connection layer that is formed between the second semiconductor chip and the second internal metal layer and provides conductive connection between the second semiconductor chip and the second internal metal layer, wherein:

a bottom side of the first semiconductor chip directly contacts a top side of the second internal metal layer;

when only a bonding pad is formed on a top side of the first semiconductor chip, a bottom side of the first mutual-connection layer directly contacts the bonding pad, and a top side of the first mutual-connection layer directly contacts a bottom side of the first internal metal layer;

when the bonding pad and an under bump metallurgy (UBM) layer are formed on the top side of the first semiconductor chip, the bottom side of the first mutual-connection layer directly contacts the UBM layer, and the top side of the first mutual-connection layer directly contacts the bottom side of the first internal metal layer;

a top side of the second semiconductor chip directly contacts a bottom side of the first internal metal layer;

when only the bonding pad is formed on a bottom side of the second semiconductor chip, a top side of the second mutual-connection layer directly contacts the bonding pad, and a bottom side of the second mutual-connection layer directly contacts a top side of the second internal metal layer; and when the bonding pad and the UBM layer are formed on the bottom side of the second semiconductor chip, the top side of the second mutual-connection layer directly contacts the UBM layer, and the bottom side of the second mutual-connection layer directly contacts the top side of the second internal metal layer.

10. The power module package of claim 9, wherein the first mutual-connection layer and the second mutual-connection layer comprise a copper (Cu) pillar and an adhesive material.

11. The power module package of claim 9, wherein the first mutual-connection layer and the second mutual-connection layer comprise a copper (Cu) pillar, and the Cu pillar forms direct contact with the first internal metal layer or the second internal metal layer through micro-welding or Cu-sintering.

12. The power module package of claim 9, wherein the first mutual-connection layer and the second mutual-connection layer comprise a solder paste.

13. The power module package of claim 9, wherein the first mutual-connection layer and the second mutual-connection layer comprise a solder bump or a solder lump.

14. The power module package of claim 9, wherein the first mutual-connection layer and the second mutual-connection layer comprise a coated core.

15. The power module package of claim 9, wherein the first mutual-connection layer and the second mutual-connection layer comprise an Au or Cu stud bump.

* * * * *